(12) United States Patent
Daeschner et al.

(10) Patent No.: US 10,355,182 B2
(45) Date of Patent: Jul. 16, 2019

(54) ENCAPSULATED LED LENS WITH BOTTOM REFLECTORS

(71) Applicant: Lumileds LLC, San Jose, CA (US)

(72) Inventors: Walter Daeschner, Eindhoven (NL); Frederic Stephane Diana, Eindhoven (NL); Mohiuddin Mala, Eindhoven (NL); Ashim Shatil Haque, Eindhoven (NL); Mark Melvin Butterworth, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 14/763,873

(22) PCT Filed: Mar. 6, 2014

(86) PCT No.: PCT/IB2014/059478
§ 371 (c)(1),
(2) Date: Jul. 28, 2015

(87) PCT Pub. No.: WO2014/141011
PCT Pub. Date: Sep. 18, 2014

(65) Prior Publication Data
US 2016/0049561 A1 Feb. 18, 2016

Related U.S. Application Data

(60) Provisional application No. 61/779,023, filed on Mar. 13, 2013.

(51) Int. Cl.
*H01L 33/58* (2010.01)
*H01L 33/60* (2010.01)
*H01L 33/54* (2010.01)

(52) U.S. Cl.
CPC .............. *H01L 33/58* (2013.01); *H01L 33/54* (2013.01); *H01L 33/60* (2013.01); *H01L 2224/13* (2013.01)

(58) Field of Classification Search
CPC .................................. H01L 33/52; H01L 33/54
(Continued)

(56) References Cited

U.S. PATENT DOCUMENTS 4,935,665 A * 6/1990 Murata ............... F21S 48/1394
257/E25.02
8,017,971 B2 9/2011 Huang
(Continued)

FOREIGN PATENT DOCUMENTS

CN 102376843 A 3/2012
JP 63-033879 A 2/1988
(Continued)

OTHER PUBLICATIONS

ACC Silicones Ltd., ACC Silicones Europe, Webpage, Oct. 18, 2009.*
(Continued)

*Primary Examiner* — Diane I Lee
*Assistant Examiner* — Keith G. Delahoussaye
(74) *Attorney, Agent, or Firm* — Volpe and Koenig, PC

(57) ABSTRACT

A lens is affixed over an LED die mounted on a substrate to encapsulate the LED die. The lens may have a top surface shaped as a dome or other shape to achieve the desired light pattern. The lens has a cavity for the LED die. A reflector pattern is molded into the bottom surface of the lens, such as one or more facet rings with an angled surface surrounding the LED die. The angled surface of the facet ring reflects the downward or shallow light emission from the LED die upward. A plurality of facet rings of different radii and heights may be formed in the bottom of the lens for shaping the light emission. Any suitable shape of facet may be used. The facet rings may be formed to cause the LED module to emit a narrow beam or other light emission patterns.

12 Claims, 1 Drawing Sheet

(58) Field of Classification Search
USPC .......................................................... 362/296
See application file for complete search history.

(56) References Cited

U.S. PATENT DOCUMENTS

| | | | | |
|---|---|---|---|---|
| 8,344,397 | B2* | 1/2013 | Lerman | H01L 25/0753 257/100 |
| 8,455,898 | B2* | 6/2013 | Anc | H01L 33/504 257/98 |
| 8,801,209 | B2* | 8/2014 | Im | G02F 1/133603 362/249.02 |
| 9,666,772 | B2 | 5/2017 | Ibbetson et al. | |
| 2003/0156417 | A1* | 8/2003 | Gasquet | F21S 48/2212 362/329 |
| 2005/0285133 | A1 | 12/2005 | Hung | |
| 2006/0157726 | A1* | 7/2006 | Loh | H01L 33/486 257/100 |
| 2008/0029720 | A1* | 2/2008 | Li | C09K 11/0883 250/581 |
| 2008/0185605 | A1* | 8/2008 | Wada | H01L 33/60 257/98 |
| 2009/0116245 | A1* | 5/2009 | Yamaguchi | G02B 3/04 362/311.01 |
| 2009/0296405 | A1* | 12/2009 | Tetsuo | F21K 9/00 362/308 |
| 2010/0006877 | A1 | 1/2010 | Chen | |
| 2010/0219430 | A1* | 9/2010 | Wu | H01L 33/60 257/91 |
| 2011/0248287 | A1 | 10/2011 | Yuan et al. | |
| 2013/0126927 | A1* | 5/2013 | Iguchi | H01L 33/60 257/98 |
| 2014/0211497 | A1* | 7/2014 | Yuan | F21K 9/52 362/555 |

FOREIGN PATENT DOCUMENTS

| | | |
|---|---|---|
| JP | 1993251747 | 9/1993 |
| JP | 06-028725 Y2 | 8/1994 |
| JP | 2001250986 A | 9/2001 |
| JP | 2005159149 A | 6/2005 |
| JP | 2007317952 A | 12/2007 |
| JP | 2010129202 A | 6/2010 |
| WO | 00/24062 A1 | 4/2000 |
| WO | WO-20060109113 A2 | 10/2006 |
| WO | 2007097664 A1 | 8/2007 |

OTHER PUBLICATIONS

B. Riegler et al, Index Matching Silicone for High Brightness LED Packaging, NuSil, presented at IMAPS Conference on Device Packaging in Scottsdale, AZ.*

* cited by examiner

ENCAPSULATED LED LENS WITH BOTTOM REFLECTORS

CROSS-REFERENCE TO PRIOR APPLICATIONS

This application is the U.S. National Phase application under 35 U.S.C. § 371 of International Application No. PCT/IB2014/059478, filed on Mar. 6, 2014, which claims the benefit of U.S. Patent Application No. 61/779,023, filed on Mar. 13, 2013. These applications are hereby incorporated by reference herein.

FIELD OF THE INVENTION

This invention relates to encapsulating light emitting diodes (LEDs) and, in particular, to encapsulating an LED die with a lens having bottom reflective features.

BACKGROUND

It is common to mount an LED die on a submount (a substrate) and position a pre-formed dome lens over the LED die to encapsulate it. The dome lens has a cavity for the LED die that contains a transparent or translucent resilient silicone. The bottom of the lens is otherwise flat. When the dome lens is pressed over the LED die, the silicone fills the voids around the LED die.

With such a structure, the light emission is generally lambertian. Light emitted from the sides of the LED die or at a shallow angle is frequently wasted light since the useful light emission is generally the light emitted in a forward direction. Such encapsulated LED dies have been mounted in small reflective conical cups to direct all the light in the forward direction, but such cups add cost and size to the LED module.

Additionally, light emitted in a downward direction may be absorbed somewhat by the submount surface and reflected at a shallow angle. Therefore, this light may also be wasted.

What is needed is a lens encapsulation technique that does not suffer from the drawbacks mentioned above.

SUMMARY

In one embodiment, an array of LED dies is mounted on a submount wafer, where electrodes of the LED dies are electrically connected to metal pads on the submount wafer. Flip chip LEDs or wire-bonded LEDs may be used. The invention also applies to processing a single LED at a time.

Lenses are pre-formed, such as by a molding process. The lenses may be formed of a hardened silicone or other suitable transparent material. The lenses are typically circular and may have a top surface shaped as a dome or other shape to achieve the desired light pattern. The lenses have a cavity for the LED die. A reflector pattern is molded into the bottom surface of the lens, such as a facet ring with an angled surface. In one embodiment, the facets are angled indentations molded into the bottom surface of the lens. The angles may be flat or rounded.

The bottom of the lens and the facets may be optionally coated with a reflective film, such as a reflective metal film.

Softened silicone is dispensed in the cavity.

When the lens is pressed over the LED die, the silicone in the cavity encapsulates the LED die, and the LED die is surrounded by the facet ring. The angled surface of the facet ring reflects the downward or shallow light emission from the LED die upward. If a reflective film does not coat the facets, the upward reflection may be by total internal reflection (TIR).

A plurality of concentric facet rings of different radii and heights may be formed in the bottom of the lens for spreading the light emission. The angles of the different facet rings may be different or the same. In another embodiment, the facet rings need not be circular but may be squares, rectangles, elliptical, or other shapes, depending on the emission pattern desired. Similarly, the lens may have any shape.

The facet rings may be formed to cause the LED module to emit a narrow beam or other light emission patterns. The top surface of the lens may be shaped to achieve any light emission pattern.

In another embodiment, the bottom surface of the lens is formed to be rounded to reflect the LED light upward.

The top surface of the submount wafer may be coated with a reflective film.

The encapsulation process may be performed on a wafer scale to simplify handling and reduce costs. After the encapsulation process, the submount wafer is singulated to form the individual LED modules.

Other embodiments are described.

BRIEF DESCRIPTION OF THE DRAWINGS

Elements that are the same or similar are labeled with the same numeral.

DETAILED DESCRIPTION

Figure 1:
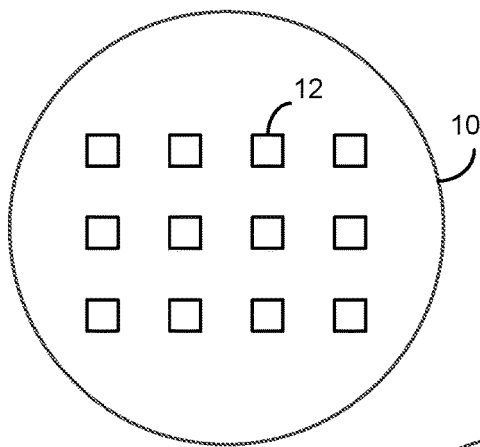
FIG. 1 is a top down view of a submount wafer populated with an array of LED dies.

FIG. 1 illustrates a submount wafer 10 populated with an array of LED dies 12. In another embodiment, only a single LED die 12 is processed at a time. The LED dies 12 may be any type, including flip chips, vertical, wire bonded, etc. In the simplified example, only twelve LED dies 12 are shown but, in an actual embodiment, hundreds of LED dies 12 would typically be mounted on a single submount wafer 10. The LED dies 12 are typically about 1 mm per side. The submount wafer 10 may be conventional, such as a ceramic wafer with conductive traces, or may be formed of another material. The wafer 10 may also be rectangular, hexagonal, or any other suitable shape.

Figure 2:
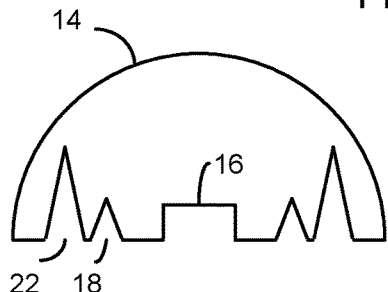
FIG. 2 is a cross-sectional view bisecting a lens, illustrating the LED die cavity and reflective facets formed in the bottom of the lens, in accordance with one embodiment of the invention.
Figure 3:
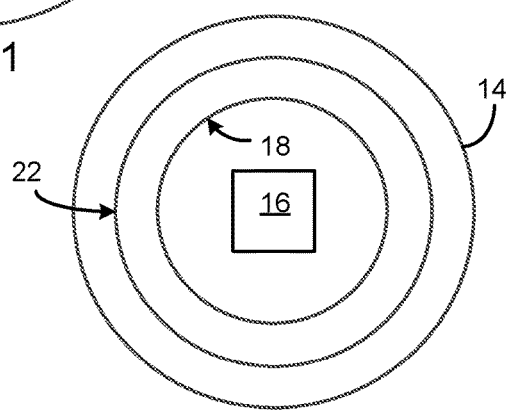
FIG. 3 is a bottom up view of the lens of FIG. 2 showing the apexes of the circular facets and the LED die cavity.
Figure 4:
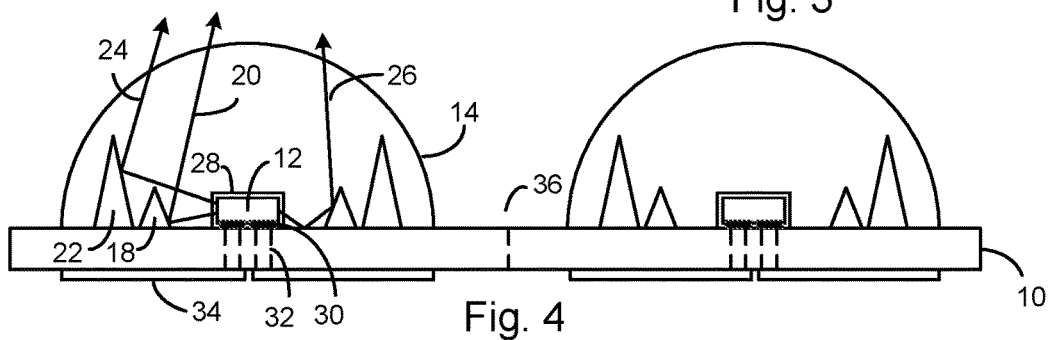
FIG. 4 is a cross-sectional view of a submount wafer populated with LED dies, where the lenses of FIG. 2 have been positioned over the LED dies to encapsulate them.

FIG. 2 is a cross-sectional view of a pre-formed lens 14, in accordance with one embodiment of the invention. FIG. 3 is a bottom up view of the lens 14 illustrating the apexes of the facets 18 and 22 and the outline of the LED die cavity 16. FIG. 4 illustrates the lenses 14 mounted over the LED dies 12. The lens 14 may be a molded silicone. For a typical LED die, the lens 14 may have a diameter about 3-5 mm.

The lens 14 has a central cavity 16, slightly larger than the LED die 12. Surrounding the cavity 16 are reflective features that redirect the LED die's side light upwards. In the example of FIG. 2, a circular first facet 18 has an angled face that reflects any side light upward, as shown in FIG. 4 by light ray 20. A circular second facet 22 extends a greater distance into the lens 14 and has an angled face that also reflects impinging light upward, such as light ray 24 in FIG. 4. Any other type of reflective feature may be formed in the bottom surface of the lens 14 to reflect the light upwards.

In another embodiment, the light-impinging faces of the facets 18 and 22 are not flat but are curved (such as parabolically) to create a narrower beam. Adding more concentric rings of facets of different heights may serve to spread out the light emission across the top surface of the lens 14.

In another embodiment, the facets 18 and 22 form rings that are squares, rectangles, elliptical, or other shape, depending on the desired emission pattern. The lens 14 may also be square, rectangular, elliptical, or other shape, depending on the desired emission pattern.

In one embodiment, the facets 18 and 22 as well as the rest of the bottom surface of the lens 14 are coated with a reflective film, such as a reflective metal film. In another embodiment, there is no reflective film coating the facets 18 and 22, and the facets 18 and 22 define an air gap. The different indices of refraction at the lens/air interface results in TIR when the light is impinging within a range of angles. Even light passing through the facets 18 and 22 may still be emitted by the light being refracted by the facets 18 and 22 and, in some cases, reflected off the surface of the submount wafer 10.

The submount wafer 10 may have a reflective layer, such as white paint or a reflective metal ring. FIG. 4 illustrates a light ray 26 reflecting off the submount wafer 10 surface.

Rather than forming rings of facets, the facets may be an array of individual facets to more uniformly distribute the light. In such a case, FIG. 2 would illustrate four separate facets, each having a rectangular reflective light-impinging surface.

An adhesive silicone 28 (FIG. 4), with an index of refraction typically between that of the LED die 12 and the lens 14, is dispensed in the cavity 16 and on the bottom surface of the lens 14. The silicone 28 in the cavity 16 is deformable. The lens 14 is then pressed over the LED die 12, as shown in FIG. 4, to cause the silicone 28 in the cavity 16 to deform around the LED die 12 to encapsulate the LED die 12. The encapsulation may be performed in a vacuum to remove air. The adhesive silicone is then cured to harden. In another embodiment, the silicone 28 used in the cavity 16 to encapsulate the LED die 12 is different from the adhesive on the bottom of the lens 14 to enable optimizing both materials. The silicone 28 in the cavity 16 need not be an adhesive and may stay resilient to adapt to differences in the coefficients of thermal expansion of the LED die 12 and the lens 14.

FIG. 4 illustrates the LED die electrodes 30 bonded to corresponding metal pads of the submount wafer 10. The metal pads of the submount wafer 10 are connected to vias 32 extending through the submount wafer 10 and terminating in bottom pads 34. The pads 34 may be soldered to a printed circuit board after singulation. A singulation line 36 is shown. Singulation may be by sawing or other technique. Singulation may divide wafer 10 into individual devices or arrays of devices.

The submount wafer 10 and the singulated submount portion may also be referred to as a substrate. The substrate may employ any type of electrical connector to a power source instead of the pads 34.

Figure 5:
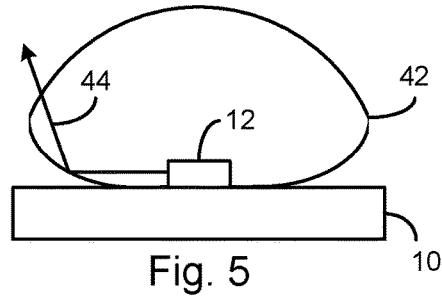
FIG. 5 is a cross-sectional view bisecting a lens in accordance with another embodiment of the invention.

FIG. 5 illustrates another shape of the bottom of the lens 42 that acts to reflect the light rays 44 of the LED die 12 upward. The shape is generally a parabolic bowl shape connected to an upper spherical shape. Many other shapes of reflective surfaces may be used to reflect the low angle LED light so that the emitted beam is relatively narrow. Virtually any beam shape is achievable. The reflection may be by TIR or the bottom surface of the lens 42 is coated with a reflective material.

The top surface of the lens 14 may be any shape to further shape the light emission pattern. Some shapes include a roughened surface, a dimpled surface, a Fresnel lens surface, a collimating lens surface, etc. A majority of the LED die emission is from its top surface, so the lens top surface shape will be the primary means for directing the light. The combination of the lens shape and reflector shape can be used to create a very narrow beam of bright light.

Rather than the lens 14 being pre-formed, the lens 14 may be molded directly over the LED dies 12 in a compression molding process and cured. In such a case no adhesive or cavity filling material is used.

The LED die 12 may include phosphor for creating any light emission color, including white light. Multiple LED dies may be interconnected and arranged in an array for a single LED module and all the LED dies encapsulated by a single lens with a suitably large cavity.

The lens 14 may contain phosphors to convert the light emitted by LED 14 into white light or any other suitable light. Typically LED 12 would emit blue light and lens 14 would include YAG phosphors.

By using the present invention, there is no need for mounting the LED die in a reflective cup.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light-emitting device, comprising:
   a light emitting diode (LED) die mounted on a substrate; and
   a solid molded lens surrounding the LED die, the lens having a width that is smaller than a width of the substrate, the lens being affixed to the substrate via an adhesive material, and the lens having a non-flat bottom surface including:
   (a) a plurality of angled first surface portions arranged to define a first continuous groove that surrounds the LED die and a second continuous groove that surrounds both the LED die and the first continuous groove, the plurality of angled first surfaces arranged over a substantially flat portion of the substrate; and
   (b) a second surface portion surrounding the LED die that is substantially parallel to the substrate, the second surface portion being affixed to the substrate via the adhesive material, the second surface portion being situated between the first continuous groove and the second continuous groove; and
   a gap between the plurality of angled first surfaces arranged and the substantially flat portion of the substrate.

2. The light-emitting device of claim 1, wherein the top surface of the lens is a dome.

3. The light-emitting device of claim 1, wherein the top surface of the lens is shaped to further redirect light.

4. The light-emitting device of claim 1, wherein:
the first continuous groove is ring-shaped and defined by two angled first surface portions that are inclined towards one another, and
the second continuous groove is ring-shaped and defined by two different angled first surface portions that are inclined towards one another.

5. The light-emitting device of claim 4, wherein the first continuous groove has a first height, and the second continuous groove has a second height that is greater than the first height.

6. The light-emitting device of claim 1, further comprising a third surface portion overlying the LED die that is surrounded by the first groove and the second groove, the third surface portion being integral with the plurality of angled first surface portions and the second surface portion, such that the third surface portion defines at least a portion of a cavity in which the LED die is located, the device further comprising a filling formed in the cavity to encapsulate the LED die.

7. The device of claim 6, the device further comprising a filling formed in the cavity to encapsulate the LED die, the filling having a first index of refraction that is greater than one of a second index of refraction of the lens and a third index of refraction of the LED die.

8. The device of claim 7, wherein the filling is also formed of the adhesive material.

9. The light-emitting device of claim 1, wherein the substrate has a reflective surface.

10. The device of claim 1, wherein the gap comprises air.

11. A method of operating a light emitting device comprising:

energizing a light emitting diode (LED) die that is mounted on a substrate, the LED die emitting light from a top surface of the LED die as well as from side surfaces of the LED die; and redirecting at least some of the light emitted by the side surfaces of the LED die by a solid molded lens surrounding the LED die, the lens having a width that is smaller than a width of the substrate, the lens being affixed to the substrate via an adhesive material, and the lens having a non-flat bottom surface including:

(a) a plurality of angled first surface portions arranged to define a first continuous groove that surrounds the LED die and a second continuous groove that surrounds both the LED die and the first continuous groove, and (b) a second surface portion surrounding the LED die that is substantially parallel to the substrate, the second surface portion being affixed to the substrate via the adhesive material, the second surface portion being situated between the first continuous groove and the second continuous groove; and a gap between the plurality of angled first surfaces arranged and a substantially flat portion of the substrate.

12. The method of claim 11, wherein:
the first continuous groove is ring-shaped and defined by two angled first surface portions that are inclined towards one another, and
the second continuous groove is ring-shaped and defined by two different angled first surface portions that are inclined towards one another.

* * * * *